United States Patent
Hasegawa et al.

(10) Patent No.: US 12,068,132 B2
(45) Date of Patent: Aug. 20, 2024

(54) RADIO-FREQUENCY POWER SUPPLY APPARATUS

(71) Applicant: DAIHEN Corporation, Osaka (JP)

(72) Inventors: Yuichi Hasegawa, Osaka (JP); Tatsuya Morii, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 170 days.

(21) Appl. No.: 17/901,477

(22) Filed: Sep. 1, 2022

(65) Prior Publication Data

US 2023/0094385 A1 Mar. 30, 2023

(30) Foreign Application Priority Data

Sep. 30, 2021 (JP) .................................. 2021-161164

(51) Int. Cl.
*H01J 37/00* (2006.01)
*H01J 37/32* (2006.01)

(52) U.S. Cl.
CPC .. *H01J 37/32183* (2013.01); *H01J 37/32128* (2013.01); *H01J 37/32165* (2013.01); *H01J 37/32174* (2013.01)

(58) Field of Classification Search
CPC .......... H01J 37/32183; H01J 37/32165; H01J 37/32174; H01J 37/3299; H01J 37/32091; H01J 37/32926
See application file for complete search history.

(56) References Cited

U.S. PATENT DOCUMENTS

| | | |
|---|---|---|
| 9,030,101 B2 | 5/2015 | Valcore, Jr. et al. |
| 9,114,666 B2 | 8/2015 | Valcore, Jr. et al. |
| 9,171,699 B2 | 10/2015 | Valcore, Jr. et al. |
| 9,197,196 B2 | 11/2015 | Valcore, Jr. et al. |
| 9,236,228 B2 | 1/2016 | Valcore, Jr. et al. |
| 9,295,148 B2 | 3/2016 | Fong et al. |
| 9,320,126 B2 | 4/2016 | Valcore, Jr. et al. |
| 9,337,000 B2 | 5/2016 | Marakhtanov et al. |
| 9,368,329 B2 | 6/2016 | Valcore, Jr. et al. |
| 9,390,893 B2 | 7/2016 | Valcore, Jr. et al. |
| 9,401,264 B2 | 7/2016 | Marakhtanov et al. |

(Continued)

FOREIGN PATENT DOCUMENTS

| | | |
|---|---|---|
| JP | 2017-188434 A | 10/2017 |
| JP | 2018-536295 A | 12/2018 |

*Primary Examiner* — Tuan T Lam
(74) *Attorney, Agent, or Firm* — Rimon P.C.

(57) ABSTRACT

A radio-frequency (RF) power supply apparatus includes a first power supply, a second power supply, and a matching device connected to the first/second power supplies. The first power supply supplies first RF power to a load by outputting first RF voltage with a first fundamental frequency. The second power supply supplies second RF power to the load by outputting second RF voltage with a second fundamental frequency lower than the first fundamental frequency. The matching device generates a clock signal with a frequency higher than the first fundamental frequency and provides the clock signal to the first power supply. The first power supply generates, by using the clock signal, a waveform signal with the same cycle as the second RF voltage. The first power supply performs, by using the clock signal, frequency modulation control on the first RF voltage to be output from the first power supply.

6 Claims, 4 Drawing Sheets

(56) References Cited

U.S. PATENT DOCUMENTS

| | | |
|---|---|---|
| 9,462,672 B2 | 10/2016 | Valcore, Jr. et al. |
| 9,502,216 B2 | 11/2016 | Valcore, Jr. et al. |
| 9,530,620 B2 | 12/2016 | Valcore, Jr. |
| 9,607,810 B2 | 3/2017 | Valcore, Jr. et al. |
| 9,620,334 B2 | 4/2017 | Lyndaker et al. |
| 9,620,337 B2 | 4/2017 | Valcore, Jr. et al. |
| 9,711,332 B2 | 7/2017 | Howald et al. |
| 9,720,022 B2 | 8/2017 | Howald et al. |
| 9,779,196 B2 | 10/2017 | Valcore, Jr. et al. |
| 9,812,294 B2 | 11/2017 | Valcore, Jr. et al. |
| 9,831,065 B2 | 11/2017 | Fong et al. |
| 9,831,071 B2 | 11/2017 | Howald et al. |
| 9,837,252 B2 | 12/2017 | Howald et al. |
| 9,842,725 B2 | 12/2017 | Valcore, Jr. et al. |
| 9,947,514 B2 * | 4/2018 | Radomski ......... H01J 37/32183 |
| 9,960,015 B2 | 5/2018 | Valcore, Jr. et al. |
| 9,997,333 B2 | 6/2018 | Valcore, Jr. et al. |
| 10,304,669 B1 | 5/2019 | Coumou et al. |
| 11,756,768 B2 * | 9/2023 | Hasegawa ......... H01J 37/32183 |
| | | 315/111.21 |
| 11,929,235 B2 * | 3/2024 | Howald ............ H01J 37/32155 |
| 2009/0284156 A1 * | 11/2009 | Banna ............... H01J 37/32155 |
| | | 315/111.21 |
| 2014/0305589 A1 | 10/2014 | Valcore, Jr. |
| 2015/0069912 A1 | 3/2015 | Valcore, Jr. et al. |
| 2015/0311041 A1 | 10/2015 | Valcore, Jr. et al. |
| 2016/0044775 A1 | 2/2016 | Valcore, Jr. et al. |
| 2016/0189937 A1 | 6/2016 | Valcore, Jr. et al. |
| 2016/0233058 A1 | 8/2016 | Marakhtanov et al. |
| 2016/0259872 A1 | 9/2016 | Howald et al. |
| 2016/0268100 A1 | 9/2016 | Valcore, Jr. et al. |
| 2016/0307736 A1 | 10/2016 | Howald et al. |
| 2016/0307738 A1 | 10/2016 | Marakhtanov et al. |
| 2016/0308560 A1 | 10/2016 | Howald et al. |
| 2016/0336152 A1 | 11/2016 | Valcore, Jr. et al. |
| 2017/0032945 A1 | 2/2017 | Valcore, Jr. et al. |
| 2017/0062187 A1 | 3/2017 | Radomski et al. |
| 2017/0084432 A1 * | 3/2017 | Valcore, Jr. ....... H01J 37/32146 |
| 2017/0178873 A1 | 6/2017 | Valcore, Jr. et al. |
| 2017/0194130 A1 | 7/2017 | Lyndaker et al. |
| 2017/0294293 A1 | 10/2017 | Howald et al. |
| 2017/0330732 A1 | 11/2017 | Valcore, Jr. et al. |
| 2018/0018418 A1 | 1/2018 | Valcore, Jr. et al. |
| 2018/0053632 A1 | 2/2018 | Fong et al. |
| 2018/0068834 A1 | 3/2018 | Valcore, Jr. et al. |
| 2018/0294140 A1 | 10/2018 | Valcore, Jr. et al. |
| 2018/0323038 A1 | 11/2018 | Valcore, Jr. et al. |
| 2019/0057847 A1 | 2/2019 | Valcore, Jr. et al. |
| 2019/0272306 A1 | 9/2019 | Howald et al. |
| 2019/0318919 A1 | 10/2019 | Lyndaker et al. |
| 2020/0067545 A1 | 2/2020 | Howald et al. |
| 2020/0074034 A1 | 3/2020 | Valcore, Jr. et al. |
| 2020/0218774 A1 | 7/2020 | Howald et al. |
| 2020/0243304 A1 | 7/2020 | Valcore, Jr. et al. |
| 2022/0165545 A1 * | 5/2022 | Burry ............... H01J 37/32926 |
| 2023/0123689 A1 * | 4/2023 | Kim ....................... H03H 7/38 |
| | | 315/111.21 |
| 2023/0207263 A1 * | 6/2023 | Hasegawa ......... H01J 37/32146 |
| | | 327/540 |
| 2023/0207269 A1 * | 6/2023 | Hasegawa ......... H01J 37/32128 |
| | | 307/52 |
| 2023/0207270 A1 * | 6/2023 | Hasegawa ......... H01J 37/32146 |
| | | 315/111.21 |
| 2023/0223235 A1 * | 7/2023 | Oldziej ............. H01J 37/32183 |
| | | 327/291 |

* cited by examiner

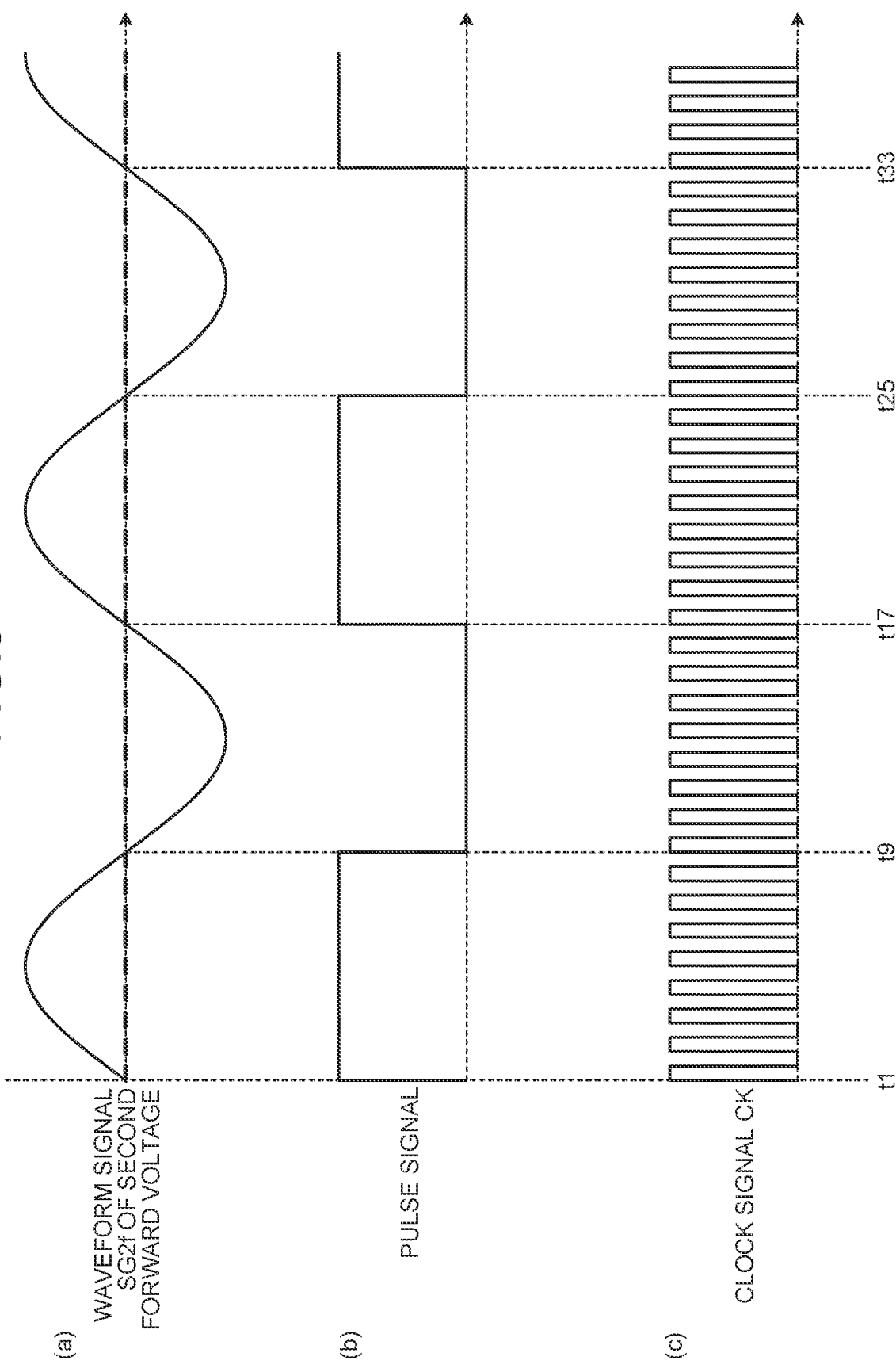

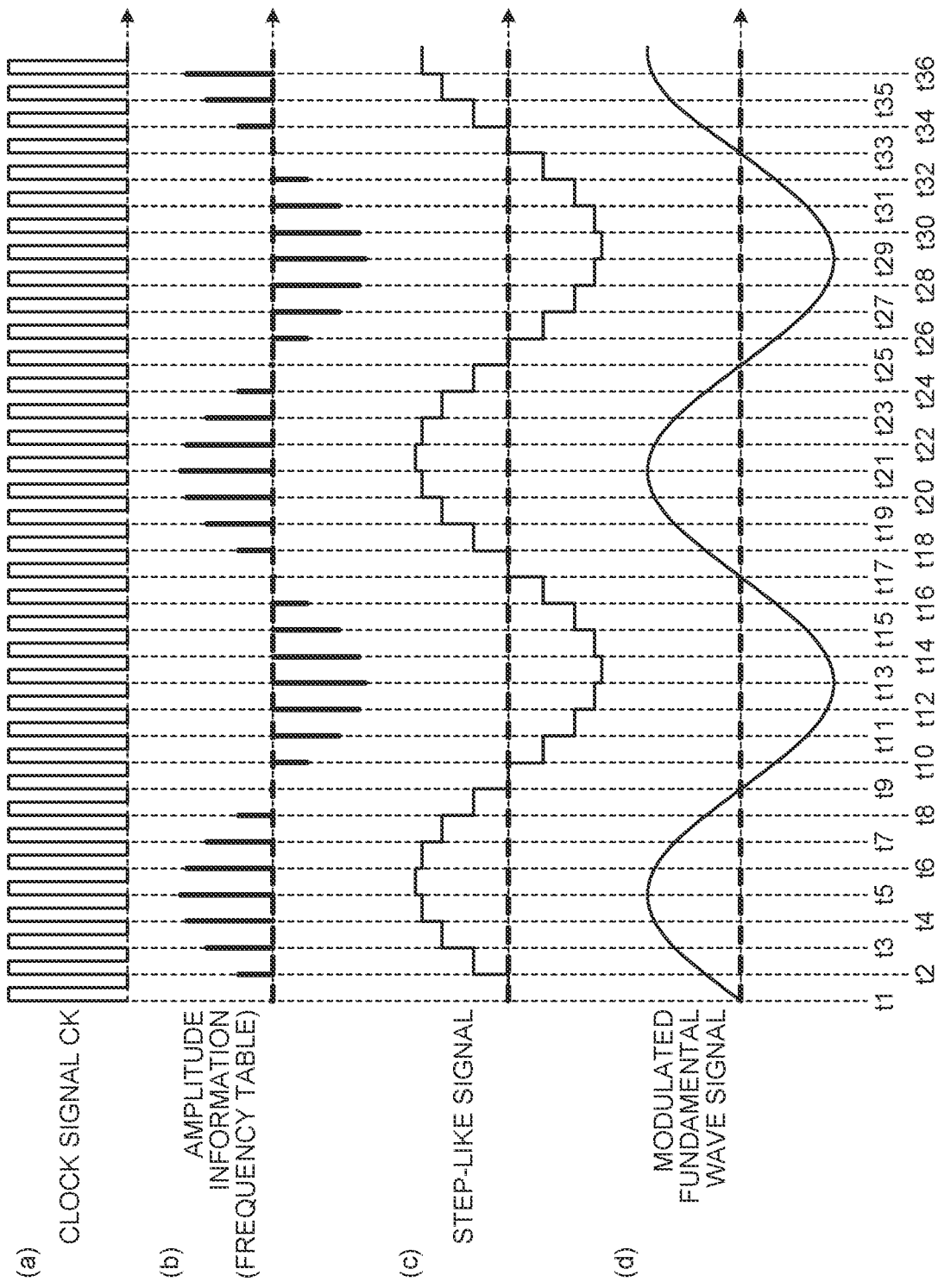

RADIO-FREQUENCY POWER SUPPLY APPARATUS

CROSS-REFERENCE TO RELATED APPLICATIONS

This application is based upon and claims the benefit of priority from Japanese Patent Application No. 2021-161164, filed on Sep. 30, 2021, the entire contents of which are incorporated herein by reference.

FIELD

The present disclosure relates generally to a radio-frequency (RF) power supply apparatus.

BACKGROUND

A radio-frequency (RF) power apparatus that is used for a plasma processing apparatus includes two RF power supplies (a first power supply and a second power supply) that output RF voltage with different fundamental frequencies (the frequencies of fundamental waves) to a load. For example, the first power supply supplies first RF power to the load by outputting first RF voltage with a first fundamental frequency F1 suitable for generating plasma. The second power supply supplies second RF power to the load by outputting second RF voltage with a second fundamental frequency F2 (lower than the first fundamental frequency F1) suitable for accelerating ions. (for example, Japanese Translation of PCT International Application Publication Laid-open No. 2018-536295, Japanese Patent Application Laid-open No. 2017-188434, and U.S. Patent Publication No. 10,304,669).

In such a case above, intermodulation distortion (IMD) may occur, causing a phenomenon where reflected power changes on the first power supply side in accordance with the cycle of the second fundamental frequency F2. There is a known technique configured to perform frequency modulation control on the first power supply to reduce reflected power due to such IMD. It is conceivable to generate a waveform signal with the same frequency as the second fundamental frequency F2 on the basis of known information about the second fundamental frequency F2 of the second power supply (for example, 400 kH has been given as the known information) and then perform frequency modulation control on the first power supply by using the generated waveform signal.

However, the cycle of the simulative waveform signal thus generated is different from the cycle of the RF voltage output from the second power supply. When the cycles of the simulative waveform signal and the RF voltage is different from each other, the effect of the frequency modulation control to reduce the reflected power attributable to IMD may deteriorate.

SUMMARY

A radio-frequency (RF) power supply apparatus according to the present discloser includes a first power supply, a second power supply, and a matching device connected individually to the first power supply and to the second power supply. The first power supply is configured to supply first RF power to a load by outputting first RF voltage with a first fundamental frequency. The second power supply is configured to supply second RF power to the load by outputting second RF voltage with a second fundamental frequency lower than the first fundamental frequency. The matching device is configured to generate a clock signal with a frequency higher than the first fundamental frequency on the basis of detected information on the second RF power, and provide the clock signal to the first power supply. The first power supply is configured to generate, by using the clock signal, a waveform signal with the same cycle as a cycle of the second RF voltage output from the second power supply, and perform, by using the clock signal, frequency modulation control on the first RF voltage to be output from the first power supply.

BRIEF DESCRIPTION OF THE DRAWINGS

FIG. 3 is a waveform diagram illustrating an operation of the RF power supply apparatus according to the embodiment; and FIG. 4 is a waveform diagram illustrating an operation of the RF power supply apparatus according to the embodiment.

DETAILED DESCRIPTION

The following describes the embodiment of a radio-frequency (RF) power supply apparatus according to the present disclosure with reference to the drawings.

Embodiment

The RF power supply apparatus according to the embodiment is an apparatus that supplies RF power to a load (for example, a plasma processing apparatus) by outputting RF voltage with a frequency in the RF band. Such an RF power supply apparatus has two RF power supplies (a first power supply and a second power supply), which individually output RF voltage with different fundamental frequencies (frequencies of the fundamental waves thereof) (also called output frequencies) to the load. For example, the first power supply supplies first RF power to the load by outputting first RF voltage with a first fundamental frequency F1 suitable for generating plasma. The second power supply supplies second RF power to the load by outputting second RF voltage with a second fundamental frequency F2 (lower than the first fundamental frequency F1) suitable for accelerating ions.

When pieces of power with different RF frequencies are supplied from different power supplies to the load, intermodulation distortion (IMD) may occur and bring about a phenomenon where reflected power changes on the first power supply side in accordance with the fundamental cycle (the cycle of the fundamental wave) of the second power supply. Thus, RF power cannot be efficiently supplied from the first power supply to the load. Therefore, in the present embodiment, frequency modulation control is performed in the following manner, whereby the reflected power attributable to IMD is reduced.

RF voltage output from the first power supply to the load is referred to as first forward voltage; and RF voltage reflected from the load and returned to the first power supply is referred to as first reflected voltage. RF voltage output from the second power supply toward the load is referred to as second forward voltage; and RF voltage reflected from the load and returned to the second power supply is referred to as second reflected voltage.

Figure 1:
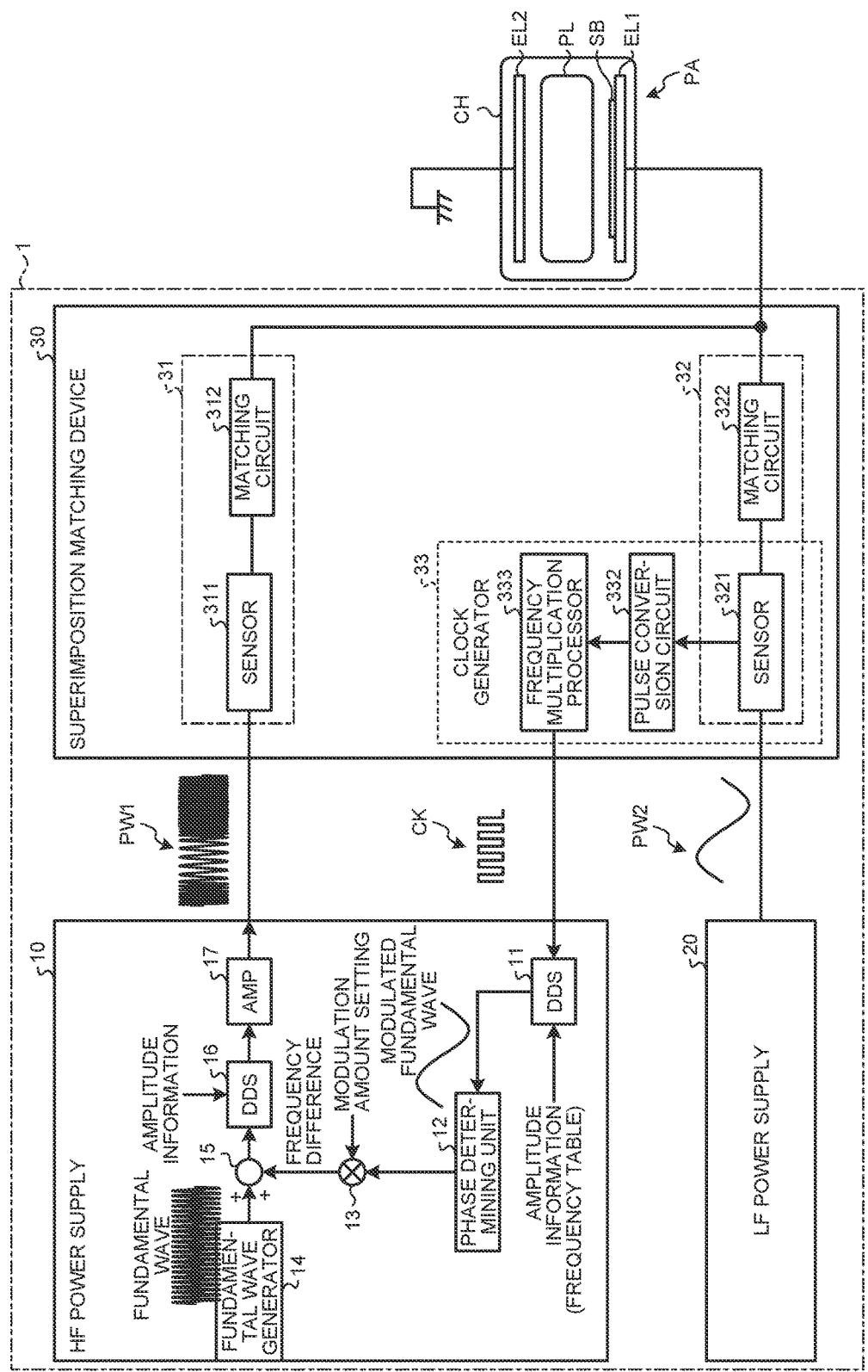
FIG. 1 is a diagram illustrating a configuration of a radio-frequency (RF) power supply apparatus according to an embodiment.

FIG. 1 is a diagram illustrating the configuration of an RF power supply apparatus 1. The RF power supply apparatus 1 is applied to a plasma processing apparatus PA. The plasma processing apparatus PA is, for example, of a parallel-plate type and has a lower electrode EL1 and an upper electrode EL2 facing each other in a chamber CH. On the lower electrode EL1, a substrate SB to be processed can be placed. The RF power supply apparatus 1 is electrically connected to the lower electrode EL1. The upper electrode EL2 is electrically connected to the ground potential. The chamber CH is connected to a gas supply apparatus (not illustrated) via an air supply pipe and to a vacuum apparatus (not illustrated) via an exhaust pipe.

The RF power supply apparatus 1 includes an HF power supply (the first power supply) 10, an LF power supply (the second power supply) 20, and a superimposition matching device (a matching unit) 30. The HF power supply 10 supplies the first RF power (first forward power) PW1 to the load by outputting the first RF voltage (the first forward voltage) with the first fundamental frequency F1. The first RF voltage has the first fundamental frequency F1, which is relatively high and is primarily suitable for generating plasma PL. The first fundamental frequency F1 is, for example, 40.68 MHz. The HF power supply 10 is also referred to as a source power supply. The fundamental frequency F1 is not limited to 40.68 MHz and may be any frequency in the RF band for industrial use, such as 13.56 MHz or 27.12 MHz.

The LF power supply 20 supplies the second RF power (second forward power) PW2 to the load by outputting the second RF voltage (the second forward voltage) with the second fundamental frequency F2 lower than the first fundamental frequency F1. The second RF voltage has the second fundamental frequency F2, which is relatively low and is suitable for accelerating ions. The second fundamental frequency F2 is, for example, 400 kHz. The LF power supply 20 is also referred to as a bias power supply. The second fundamental frequency F2 is not limited to 400 kHz, and may be any other frequency.

The superimposition matching device 30 is electrically connected individually to the HF power supply 10 and to the LF power supply 20. The superimposition matching device 30 is electrically connected to and between the HF power supply 10 and the lower electrode EL1 and to and between the LF power supply 20 and the lower electrode EL1. The superimposition matching device 30 performs first impedance matching between the HF power supply 10 and the lower electrode EL1 and performs second impedance matching between the LF power supply 20 and the lower electrode EL1. In a state where the first impedance matching and the second impedance matching are performed, the superimposition matching device 30 receives the first RF power from the HF power supply 10 and receives the second RF power from the LF power supply 20. The superimposition matching device 30 then superposes the first RF power and the second RF power and supplies the superimposed power to the lower electrode EL1.

Respective configurations of the RF power supply apparatus 1 and the plasma processing apparatus PA are not limited to the example illustrated in FIG. 1. For example, there are various configurations such as one where, while the first RF power output from the HF power supply 10 is supplied to the upper electrode EL2 via the superimposition matching device 30, the second RF power output from the LF power supply 20 is supplied to the lower electrode EL1 via the superimposition matching device 30. The RF power supply apparatus 1 can also be used for another configuration such as this one.

The superimposition matching device 30 includes a first matching unit 31, a second matching unit 32, and a clock generator 33. The first matching unit 31 includes a sensor 311 and a matching circuit 312. The second matching unit 32 includes a sensor 321 (a detector 321) and a matching circuit 322. The dock generator 33 includes the sensor 321, a pulse conversion circuit 332, and a frequency multiplication processor 333. The second matching unit 32 and the clock generator 33 share the sensor 321. This allows the superimposition matching device 30 to have a compact configuration.

In the first matching unit 31, the sensor 311 detects a waveform signal SG1$f$ of the first forward voltage output from the HF power supply 10 and detects a waveform signal SG1$r$ of the first reflected voltage reflected from the matching circuit 312. The matching circuit 312 includes a variable impedance circuit. The matching circuit 312 changes, by the operation of a control circuit (not illustrated), the impedance value of the variable impedance circuit in accordance with the waveform signals SG1$f$ and SG1$r$ detected by the sensor 311 (so that, for example, a reflection coefficient calculated from the waveform signals SG1$f$ and SG1$r$ can be reduced). Needless to say, the impedance value of the variable impedance circuit may be changed so that reflected power, instead of the reflection coefficient, can be reduced. The variable impedance circuit includes, for example, a variable capacitor and an inductor (not illustrated), thereby being enabled to change the impedance value by varying the capacitance of the variable capacitor (the same can be applied to the second matching unit 32). In the above descriptions, the reflection coefficient is calculated by using the waveform signal SG1$f$ of the first forward voltage and the waveform signal SG1$r$ of the first reflected voltage. However, it is also possible to detect voltage waveform signals and current waveform signals and calculate the reflection coefficient on the basis of these voltage waveform signals and current waveform signals (the same can be applied to the second matching unit 32).

In the second matching unit 32, the sensor 321 detects a waveform signal SG2$f$ of the second forward voltage output from the LF power supply 20 and detects a waveform signal SG2$r$ of the second reflected voltage reflected from the matching circuit 322. The matching circuit 322 includes the variable impedance circuit. The matching circuit 322 changes, by the operation of the control circuit (not illustrated), the impedance value of the variable impedance circuit in accordance with the waveform signals SG2$f$ and SG2$r$ detected by the sensor 321 (so that, for example, a reflection coefficient calculated from the waveform signals SG2$f$ and SG2$r$ can be reduced). Needless to say, the impedance value of the variable impedance circuit may be changed so that reflected power, instead of the reflection coefficient, can be reduced.

In the clock generator 33, the pulse conversion circuit 332 (a conversion unit 332) converts the waveform signal SG2$f$ of the second forward voltage detected by the sensor 321 into a pulse signal. By the conversion, the pulse signal is obtained as a rectangular signal with a second fundamental frequency F2. The pulse conversion circuit 332 includes a comparator and converts a sinusoidal signal into a rectangular signal by using the comparator. The frequency multiplication processor 333 multiplies, by N, the pulse signal with the second fundamental frequency F2 to generate a clock signal CK with a frequency F3. N is an integer larger than 1. The frequency F3 is at least twice the fundamental frequency F1. This is to prevent aliasing.

In a case where F2=400 kHz and N=250, F3=F2×N=400 kHz×250=100 MHz is derived. The clock signal CK is a signal generated in accordance with the second forward voltage. Thus, the clock signal CK can be a signal synchronized with the second forward voltage. The frequency multiplication processor 333 provides, to the HF power supply 10, the clock signal CK with the frequency F3.

The HF power supply 10 receives the clock signal CK generated by the clock generator 33. The HF power supply 10 generates a modulated fundamental wave signal corresponding to the second forward voltage in accordance with the clock signal CK. The HF power supply 10 generates, by using the modulated fundamental wave signal, a waveform signal with the same cycle as the cycle of the second forward voltage (the second RF voltage) output from the LF power supply 20. This waveform signal is used for frequency modulation control performed on the first forward voltage (the first RF voltage) to be output from the HF power supply 10.

The HF power supply 10 includes a direct digital synthesizer (DDS) 11, a phase determining unit 12, a multiplier 13, a fundamental wave generator 14, an adder 15, a DDS 16, and an amplifier (AMP) 17.

The DDS 11 receives the clock signal CK from the superimposition matching device 30 and receives amplitude information from the HF power supply 10. The amplitude information is table information in which pieces of amplitude at individual clock timings corresponding to the frequency of a signal to be generated (for example, a sinusoidal signal) are stored sequentially. The amplitude information is also called a frequency table. For example, in a case where the frequency of the clock signal CK is F3 while the frequency of a signal to be generated is the second fundamental frequency F2, the amplitude information is table information in which F3/F2=N pieces of amplitude are stored sequentially. The DDS 11 generates, by using frequency information and the amplitude information, a modulated fundamental wave signal with the same frequency as the second fundamental frequency F2. This modulated fundamental wave signal is generated as a sinusoidal signal, for example. The DDS 11 provides the modulated fundamental wave signal to the phase determining unit 12. The modulated fundamental wave signal is equivalent to the second forward voltage generated by the LF power supply 20. The cycle of the modulated fundamental wave signal is the same as the cycle of the second forward voltage.

The fundamental wave generator 14 generates a fundamental wave signal with a frequency equal to the first fundamental frequency F1. The fundamental wave signal is generated, for example, in the form of a sinusoidal signal. The fundamental wave generator 14 provides the fundamental wave signal to the adder 15.

The phase determining unit 12 determines, in accordance with the modulated fundamental wave signal, a phase at which modulation needs to be started, and then obtains a base modulation amount standardized in accordance with the determined phase. For example, one cycle of the modulated fundamental wave signal is divided into multiple segments, and the base modulation amount is calculated in accordance with the conditions, such as the degrees of IMD occurrence, of the individual segments. The phase determining unit 12 provides the base modulation amount to the multiplier 13.

The multiplier 13 receives the base modulation amount from the phase determining unit 12 and receives a modulation amount setting from the HF power supply 10. The modulation amount setting includes a gain used for converting the base modulation amount into a frequency difference. The multiplier 13 multiplies the base modulation amount by the modulation amount setting, thereby obtaining a frequency difference ΔF. The multiplier 13 provides the frequency difference ΔF to the adder 15.

The adder 15 receives the fundamental wave signal with the first fundamental frequency F1 and receives the frequency difference ΔF. The adder 15 adds the frequency difference to the fundamental wave signal, thus generating frequency information that indicates the first fundamental frequency F1+ΔF. The adder 15 provides the frequency information to the DDS 16.

The DDS 16 receives the frequency information from the adder 15 and receives amplitude information from the HF power supply 10. The DDS 16 generates, by using the frequency information and the amplitude information, an RF signal having a waveform obtained by applying frequency modulation to the fundamental wave with the first fundamental frequency F1 with the frequency difference ΔF. The DDS 16 provides the generated RF signals to the AMP 17.

The AMP 17 amplifies the RF signal output from the DDS 16. The AMP 17 outputs the amplified RF signal (the first forward voltage) to the superimposition matching device 30.

Figure 2:
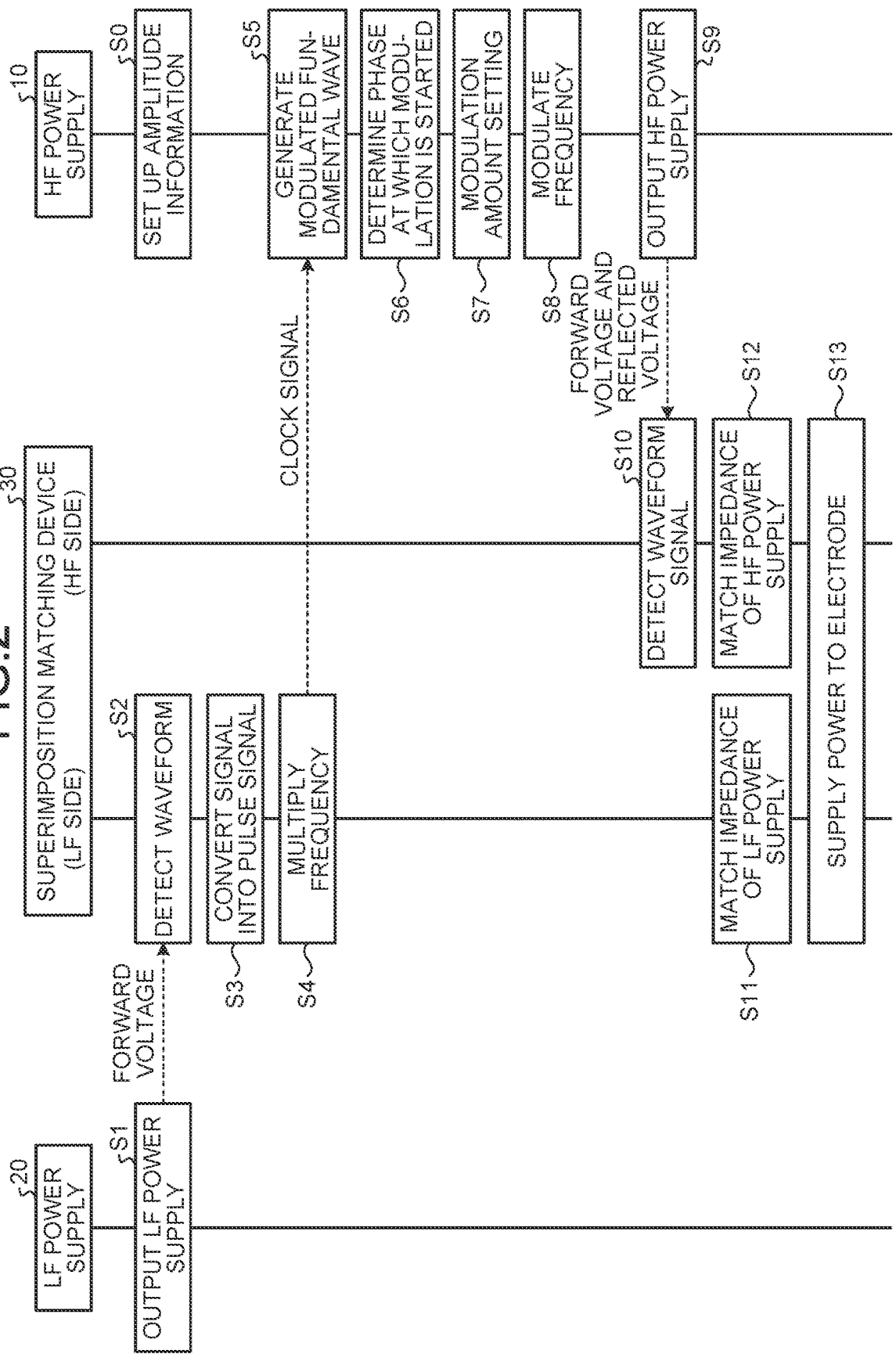
FIG. 2 is a sequence chart illustrating an operation of the RF power supply apparatus according to the embodiment.

Next, the operation of the RF power supply apparatus 1 is described with reference to FIGS. 2 to 4. FIG. 2 is a sequence chart illustrating the operation of the RF power supply apparatus 1. FIGS. 3 and 4 are waveform diagrams illustrating the operation of the RF power supply apparatus 1.

Amplitude information is previously input to and set up in the HF power supply 10 (S0). The amplitude information is table information in which pieces of amplitude at individual clock timings corresponding to the frequency of a signal to be generated (for example, a sinusoidal signal) are stored sequentially. The amplitude information is also called a frequency table.

The LF power supply 20 generates second forward voltage and outputs the second forward voltage to the superimposition matching device 30 in response to a startup command by the RF power supply apparatus 1 (S1).

The superimposition matching device 30 detects the waveform signal SG2f of the second forward voltage output from the LF power supply 20 and detects the waveform signal SG2r of the second reflected voltage reflected from the matching circuit 322 (S2). The superimposition matching device 30 detects the sinusoidal waveform signal SG2f with the second fundamental frequency F2, for example, as illustrated in the waveform (a) of FIG. 3. The period from timing t1 to timing t17 and the period from the timing t17 to timing t33 are each one cycle of the waveform signal SG2f, which corresponds to the fundamental cycle of the LF power supply 20.

The superimposition matching device 30 converts the waveform signal SG2f into a pulse signal (S3). The superimposition matching device 30 may generate a pulse signal as illustrated in the waveform (b) of FIG. 3, for example, by converting the sinusoidal signal into an H level and a Low level: an H level for a period where the amplitude of the sinusoidal signal exceeds the center of the amplitude depicted by a dotted line in the waveform (a) of FIG. 3, and an L level for a period where the amplitude of the sinusoidal signal is below the center of the amplitude. The period from the timing t1 to the timing t17 and the period from the timing t17 to the timing t33 are each one cycle of the pulse signal, which corresponds to the fundamental cycle of the LF power supply 20.

The superimposition matching device 30 multiplies, by N, a pulse signal with a frequency equal to the second fundamental frequency F2, thereby generating the clock signal CK with the frequency F3 (S4). A relation expressed by F3=F2×N holds. For example, the superimposition matching device 30 multiplies, by 8, the frequency of the pulse signal illustrated in the waveform (b) in FIG. 3, thereby generating the clock signal CK as illustrated in the waveform (c) of FIG. 3. In the waveform (c) of FIG. 3, a case of N=8 is exemplified to simplify the illustration. In reality, however, N is a number that satisfies the relation F3=F2×N on condition that the frequency F3 is at least twice as high as the first fundamental frequency F1. The superimposition matching device 30 outputs the clock signal CK to the HF power supply 10.

The HF power supply 10 generates a modulated fundamental wave signal in accordance with the clock signal CK (S5). The HF power supply 10 receives, for example, the clock signal CK illustrated in the waveform (a) of FIG. 4. At individual timings t1 to t36 that are synchronized with those of the clock signal CK, the HF power supply 10 generates a step-like signal as illustrated in the waveform (c) of FIG. 4 by referring to the amplitude information (the frequency table) such as the one illustrated in the waveform (b) of FIG. 4. After finishing referring to pieces of amplitude for one cycle in the amplitude information (the frequency table) for the period from the timing t1 to the timing t16, the HF power supply 10 refers to the amplitude information (frequency table) at the next timing t17 for the amplitude at the beginning of one cycle again. This is repeated for each cycle of the sinusoidal wave. The HF power supply 10 generates a sinusoidal, modulated fundamental wave signal as the one illustrated in the waveform (d) of FIG. 4 by smoothing the step-like signal illustrated in the waveform (c) of FIG. 4.

The HF power supply 10 determines, in accordance with the modulated fundamental wave signal, a phase at which the modulation needs to be started (S6), and then obtains a base modulation amount standardized in accordance with the determined phase. The HF power supply 10 obtains the frequency difference ΔF by multiplying the base modulation amount by a modulation amount selling (S7). The modulation amount setting includes a gain for converting the base modulation amount into a frequency difference. The HF power supply 10 adds the frequency difference to the fundamental wave signal, thus generating frequency information that indicates the first fundamental frequency F1+ΔF. Thus, the HF power supply 10 modulates, by using the frequency difference ΔF, the frequency of the fundamental wave with the first fundamental frequency F1 (S8). The HF power supply 10 generates, by using the frequency information and the amplitude information, the first RF voltage (the first forward voltage), and then outputs the first RF voltage to the superimposition matching device 30 (S9).

The superimposition matching device 30 detects the waveform signal SG1f of the first forward voltage output from the HF power supply 10 and detects the waveform signal SG1r of reflected voltage reflected from the matching circuit 312 side (S10). The superimposition matching device 30 performs the second impedance matching between the LF power supply 20 and the lower electrode EL1 on the basis of based on the waveform signals SG2f and SG2r detected in S2 (S11). In parallel, the superimposition matching device 30 performs the first impedance matching between the HF power supply 10 and the lower electrode EL1 on the basis of the waveform signals SG1f and SG1r detected in S10 (S12). In the state where the first impedance matching and the second impedance matching are performed, the superimposition matching device 30 receives the first forward voltage from the HF power supply 10 and receives the second forward voltage from the LF power supply 20. The superimposition matching device 30 then superposes the first forward voltage (the first RF power) and the second forward voltage (the second RF power) and provides the superimposed power to the lower electrode EL1 (S13).

As described above, in the RF power supply apparatus 1 according to the present embodiment, the superimposition matching device 30 generates the clock signal CK in accordance with the second forward voltage and provides the clock signal CK to the HF power supply 10. The HF power supply 10 generates, by using the modulated fundamental wave signal, a waveform signal with the same cycle as the cycle of the second forward voltage (the second RF voltage) output from the LF power supply 20. This waveform signal is used for frequency modulation control performed on the first forward voltage (the first RF voltage) to be output from the HF power supply 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The RF power supply apparatus according to the present disclosure enables the first power supply to generate a waveform signal with the same cycle as the cycle of the RF voltage output from the second power supply.

What is claimed is:

1. A radio-frequency (RF) power supply apparatus comprising:
   a first power supply configured to supply first RF power to a load by outputting first RF voltage with a first fundamental frequency;
   a second power supply configured to supply second RF power to the load by outputting second RF voltage with a second fundamental frequency lower than the first fundamental frequency; and
   a matching device connected individually to the first power supply and to the second power supply and configured to
      generate a clock signal with a frequency higher than the first fundamental frequency on the basis of detected information on the second RF power, and
      provide the clock signal to the first power supply,
   wherein the first power supply is configured to
      generate, by using the clock signal, a waveform signal with the same cycle as a cycle of the second RF voltage output from the second power supply, and
      perform, by using the clock signal, frequency modulation control on the first RF voltage to be output from the first power supply.

2. The RF power supply apparatus according to claim 1, wherein the matching device is configured to
   extract, from the detected information on the second RF power, a pulse signal with the same frequency as the second fundamental frequency, and generate the clock signal by multiplying frequency of the pulse signal.

3. The RF power supply apparatus according to claim 2, wherein the matching device includes:
- a sensor configured to detect the second RF voltage and output a waveform signal detected from the second RF voltage;
- a conversion circuit configured to convert the detected waveform signal into the pulse signal; and
- a frequency multiplication processor configured to multiply the frequency of the pulse signal and generate the clock signal.

4. The RF power supply apparatus according to claim 1, wherein the clock signal has a clock frequency that is at least twice the first fundamental frequency.

5. The RF power supply apparatus according to claim 2, wherein the clock signal has a clock frequency that is at least twice the first fundamental frequency.

6. The RF power supply apparatus according to claim 3, wherein the clock signal has a clock frequency that is at least twice the first fundamental frequency.

\* \* \* \* \*